United States Patent
Isaac et al.

(10) Patent No.: US 8,230,154 B2
(45) Date of Patent: Jul. 24, 2012

(54) FULLY ASSOCIATIVE BANKING FOR MEMORY

(75) Inventors: Roger Isaac, Santa Clara, CA (US);
Stephan Rosner, Campbell, CA (US);
Qamrul Hasan, Mountain View, CA (US); Jeremy Mah, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 741 days.

(21) Appl. No.: 11/625,150

(22) Filed: Jan. 19, 2007

(65) Prior Publication Data
US 2008/0177930 A1   Jul. 24, 2008

(51) Int. Cl.
*G06F 12/06* (2006.01)
(52) U.S. Cl. ............................................................. 711/5
(58) Field of Classification Search .................. None
See application file for complete search history.

(56) References Cited

U.S. PATENT DOCUMENTS

| | | | | |
|---|---|---|---|---|
| 5,745,913 A * | 4/1998 | Pattin et al. | .................... | 711/105 |
| 5,761,732 A * | 6/1998 | Shaberman et al. | ........... | 711/157 |
| 5,848,428 A * | 12/1998 | Collins | .......................... | 711/127 |
| 5,983,325 A * | 11/1999 | Lewchuk | ...................... | 711/137 |
| 6,629,208 B2 * | 9/2003 | Sturges et al. | ................ | 711/129 |
| 6,691,205 B2 * | 2/2004 | Zilberman | ..................... | 711/103 |
| 6,880,056 B2 | 4/2005 | Kootstra | | |
| 6,901,500 B1 * | 5/2005 | Hussain et al. | ................ | 711/213 |
| 6,910,095 B2 * | 6/2005 | Zsohar | .............................. | 711/5 |
| 7,082,491 B2 | 7/2006 | Janzen | | |
| 7,133,975 B1 | 11/2006 | Isaac et al. | | |
| 7,133,995 B1 | 11/2006 | Isaac et al. | | |
| 7,664,905 B2 * | 2/2010 | Jarosh et al. | ....................... | 711/5 |
| 2002/0099920 A1 * | 7/2002 | Shoji | .............................. | 711/170 |
| 2002/0129201 A1 * | 9/2002 | Maiyuran et al. | ............. | 711/113 |
| 2003/0058724 A1 * | 3/2003 | Wilson | ........................... | 365/222 |
| 2003/0093644 A1 * | 5/2003 | Fanning | ........................ | 711/210 |
| 2005/0146974 A1 * | 7/2005 | Halbert et al. | ........... | 365/230.03 |
| 2006/0181909 A1 * | 8/2006 | Hinojosa et al. | ................. | 365/49 |
| 2008/0285372 A1 * | 11/2008 | Sohn et al. | ............... | 365/230.05 |
| 2009/0055617 A1 * | 2/2009 | Bansal et al. | .................. | 711/171 |

* cited by examiner

*Primary Examiner* — Duc Doan
(74) *Attorney, Agent, or Firm* — Turocy & Watson, LLP

(57) ABSTRACT

A system is provided that facilitates read access in a memory device. The system comprises a plurality of row addresses buffers that store high order addresses associated with one or more software threads. The system further comprises a plurality of row data buffers. The row data buffers are each associated with at least one row address buffer and store row data within the range of the high order addresses of the row address buffers. The system increase memory device performance by limiting the latency associated with context switching. The plurality of row address buffers and row data buffers enables software threads to associate with one or more buffers and maintain efficient subsequent memory accesses despite context switching.

6 Claims, 10 Drawing Sheets

FULLY ASSOCIATIVE BANKING FOR MEMORY

BACKGROUND

Memory devices are addressed through address buses. An address bus can be as wide as the size of the address utilize to locate data in the memory devices. In order to reduce the total number of pins and to simplify the external bus of the memory device, the address bus is typically made more narrow than the address size. For example, a memory device utilizing 32-bit addresses may have an address bus that is 13-bits wide. Accordingly, the narrow bus requires multiple address cycles in order to send the 32-bit address to the memory device. Address patterns to memory devices typically show a locality. The locality results in subsequent memory accesses to targeting a region of memory that share a same high order address. As a result, redundant information may be sent, increasing latency and decreasing performance of memory devices.

Some memory devices reduce the overhead associated with redundant information resulting from multiple address cycles by providing a buffer or cache that is faster than a primary memory array. Portions of the primary memory array are loaded into the cache. Subsequent memory accesses that hit that portion are output from the faster cache. However, context switching among software threads results in flushing and reloading data that may have already been loaded previously. For example, a first software thread loads a first portion of memory into the cache. Due to context switching, a second software thread gains control. The second software thread accessing a second portion of the memory and, accordingly, the cache is flushed and loaded with the second portion. The first software thread needs to reload the cache when the first software thread gains context once again. Therefore, context switching increases latencies and reduces performance of memory devices.

SUMMARY

The following presents a simplified summary in order to provide a basic understanding of some aspects of the disclosed innovation. This summary is not an extensive overview, and it is not intended to identify key/critical elements or to delineate the scope thereof. Its sole purpose is to present some concepts in a simplified form as a prelude to the more detailed description that is presented later.

The subject matter disclosed and claimed herein, in one aspect thereof, comprises a system that facilitates efficient read access of memory devices. The system comprises a plurality of row address buffers and a plurality of row data buffers. The row address buffers store high order addresses associated with one or more software threads. The row data buffers store stores data from the row addressed by the high order addresses from the row address buffers.

Upon the first access into the memory device, a row address buffer from the set of buffers is selected and loaded with a row address. A page of the row addressed by the row address buffer is copied to a row data buffer selected from the set of row data buffers. A subsequent access utilizing the same row address but a different page results in the new page being copied to a second row data buffer that is associated to the row address buffer. If a subsequent access lies outside the range of the first row address buffer, a new row address buffer is selected from the plurality of row address buffers and loaded with the new row address. Additional row data buffers are selected, loaded with page data and associated with the new row address buffer.

In accordance with other aspect of the subject disclosure, a replacement policy is utilized to select a row address buffer or a row data buffer when no more buffers are available. Utilizing the replacement policy, row address buffers and row data buffers are flushed and loaded with new data.

To the accomplishment of the foregoing and related ends, certain illustrative aspects of the disclosed innovation are described herein in connection with the following description and the annexed drawings. These aspects are indicative, however, of but a few of the various ways in which the principles disclosed herein can be employed and is intended to include all such aspects and their equivalents. Other advantages and novel features will become apparent from the following detailed description when considered in conjunction with the drawings.

DETAILED DESCRIPTION

Figure 1:
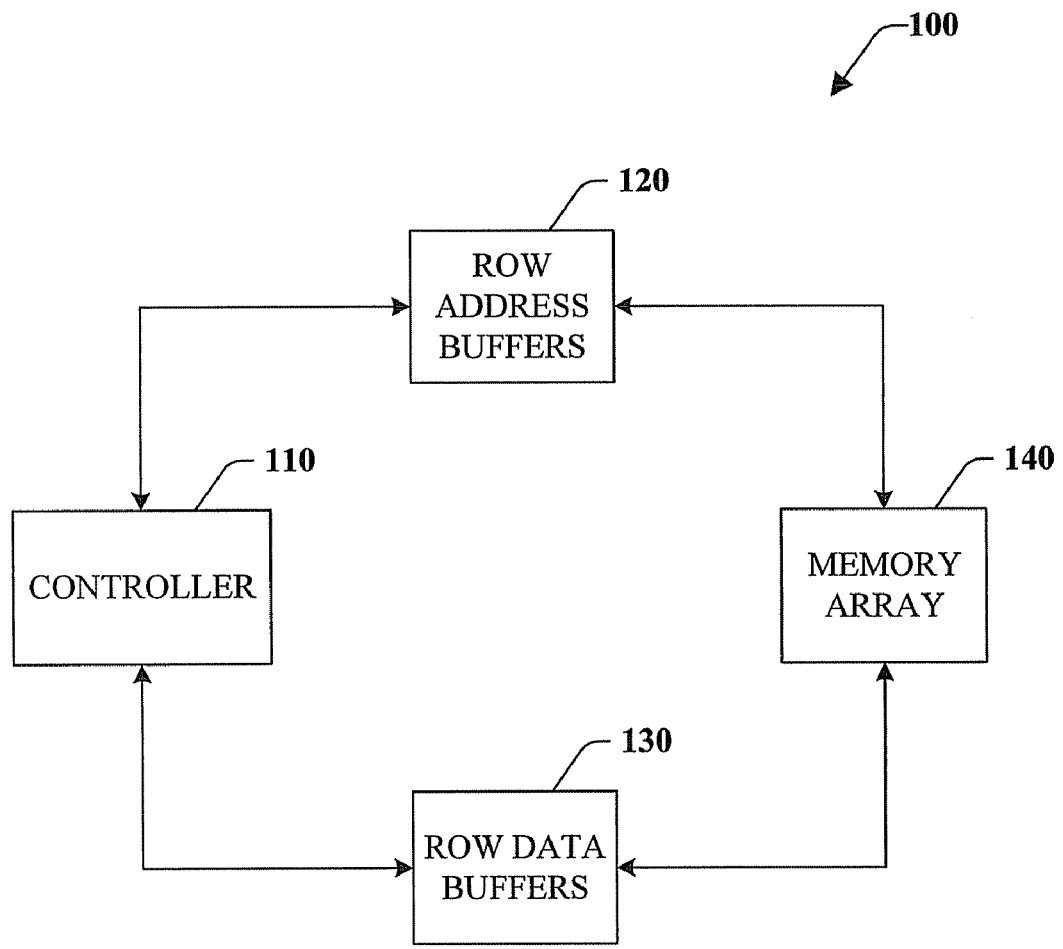
FIG. 1 illustrates a block diagram of a fully associative memory banking system in accordance with one aspect of the invention.

The innovation mitigates sending redundant addressing information in a memory device thereby decreasing or eliminating access latency resulting in a higher performance memory device. A set of high order address buffers and a set of row data buffers are defined or identified. After power up, the memory device does not have any addresses or data stored in the sets of high order address buffers and row data buffers. Consequently, the innovation allows the first read access into the memory device loads an address register pointing to a specific row address. The addresses row can be copied to a specific row data register. The specific row address and specific row data register are selected from the sets of high order address buffers and row data buffers by a controller that provides a pointer to a specific row address and specific row data register in commands for loading an address and loading a page.

In one embodiment, at least about a 25% performance improvement is obtained when using row address buffer and row data buffer pairs that are tied together compared to a similar memory device without tied or freely associated row address buffer and row data buffer pairs. In another embodiment, at least about a 50% performance improvement is obtained when using row address buffer and row data buffer pairs that are tied together compared to a similar memory device without tied or freely associated row address buffer and row data buffer pairs. In yet another embodiment, freely associating row address buffers and row data buffers results in at least about a 10% performance improvement compared to a similar memory device with tied row address buffer and row data buffer pairs.

The innovation is now described with reference to the drawings, wherein like reference numerals are used to refer to like elements throughout. In the following description, for purposes of explanation, numerous specific details are set forth in order to provide a thorough understanding thereof. It may be evident, however, that the innovation can be practiced without these specific details. In other instances, well-known structures and devices are shown in block diagram form in order to facilitate a description thereof.

Referring initially to FIG. 1, a memory system 100 is illustrated. The system 100 includes a controller 110 that facilitates access to and interaction with the memory. Specifically, controller 110 facilitates writing and reading data to and from a memory array 140. The memory array 140 can be non-volatile memory utilized for the task of secondary storage, or long-term persistent storage. The memory array 140 may be flash memory but it is to be appreciated memory array 140 may be any type of non-volatile memory may be utilized. NAND or NOR configurations of non-volatile memory are typically employed. Controller 110 utilizes a set of row address buffers 120 and a set of row data buffers 130 to address and access data within the memory array 140. Typically, to save pins utilized to access memory array 140, the address bus is made narrow. For example, if 13 pins are utilized in a memory bus, a 32-bit address needs to be broken down into multiple address cycles. To prevent transmission of redundant addressing information, row address buffers 120 and row data buffers 130 are utilized to bank addressing information for quick data access on subsequent data requests.

Upon a first read access into the memory system 100, the controller 110 loads a high order address or row address into a row address buffer in the set of row address buffers 120. A lower order address or page address associated with the row address in the first read access into system 110 is utilized to load data into a row data buffer in the set of a plurality of row data buffers 130. Controller 110 combines the row address in the row address buffer with the page address to generate a complete address of data in the memory array 140. The resultant data is stored in the row data buffer from the set of row data buffers 130. If a subsequent read access into the memory system 110 is the same address, the data from the memory array 140 at that address is output from the row data buffer previously loaded with the data. However, if the read access has a different page address but the same row address, the new page address is combined with the previously loaded contents of the row address buffer. The data at this combined address in the memory array 140 is stored in another row data buffer such as a second row data buffer from the set of row data buffers 130. The buffer utilization leverages the locality of accesses within a given software thread to improve memory access performance.

Figure 2:
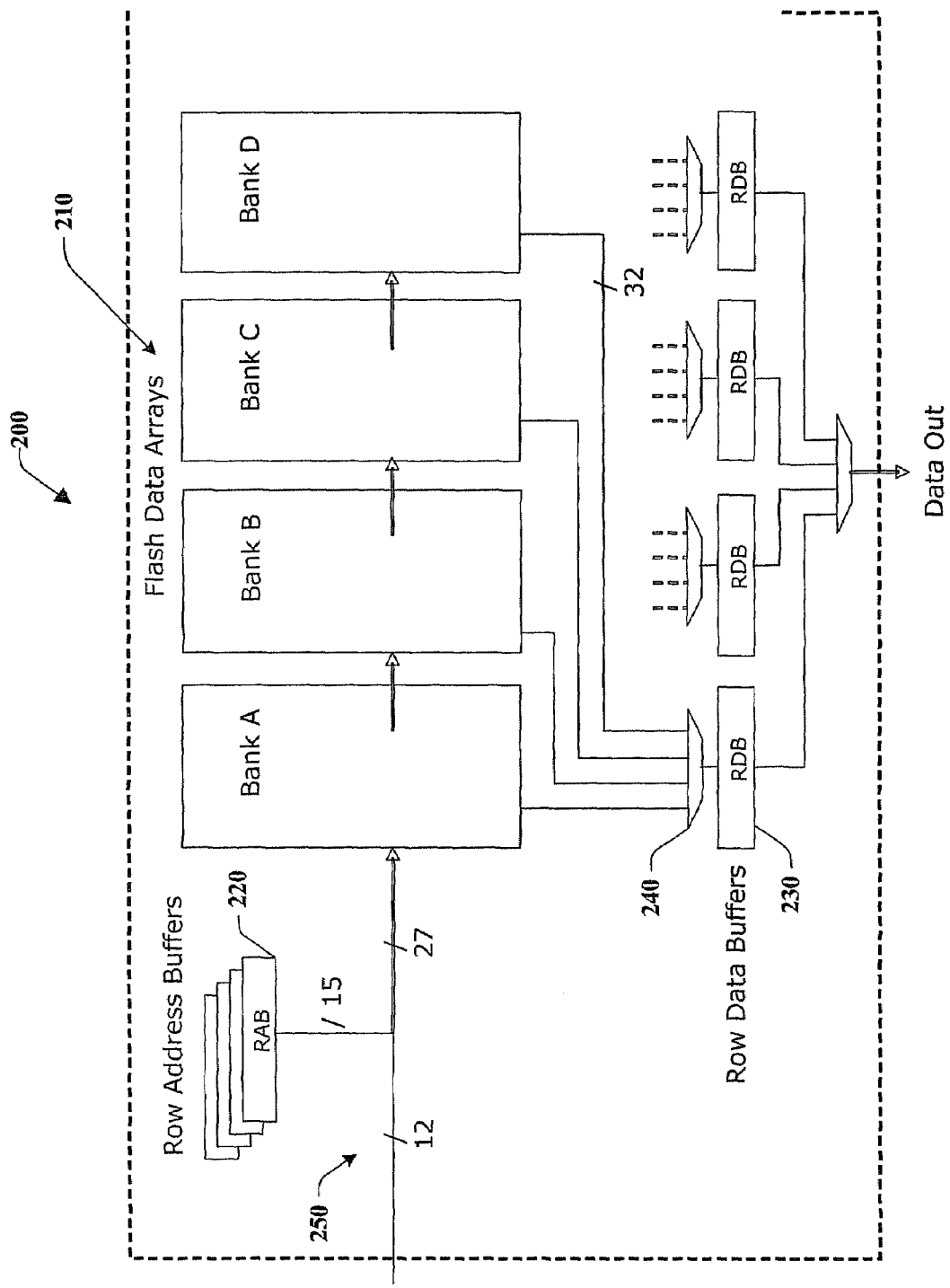
FIG. 2 illustrates a block diagram of address buffers in a memory system in accordance with one aspect of the invention.

In more detail, FIG. 2 illustrates the buffer components of a memory system 200. Memory system 200 includes a set of row address buffers 120. In system 200, to aide explanation, data in the flash data arrays 210 is addressed via a 32-bit address for example. It is to be appreciated that different size addresses can be utilized, such as a 16-bit address or a 48-bit address. Similarly, the page address 250 is shown by example to be 12 bits and the row address is shown by example to be 15 bits, but it is to be appreciated that different sizes or combinations of sizes can be utilized.

Flash data arrays include a plurality or several columns or data banks. Although four data banks labeled banks A-D are shown, there may be more than four data banks or less than four data banks depending on the address size and the distribution of address bits between a row address buffer 220 and the page address 250. In FIG. 2, the 12-bits of the page address 250 is combined with 15-bits of the row address buffer 220 to produce a 27-bit address. The data located at the 27 bit address in each of the data banks A-D is sent to a multiplexor or selector 240. The remaining 5 bits of the 32 bit address are utilized by the selector 240 to select data from one of the data banks A-D for loading into row data buffer 230. The data loaded in row data buffer 230 may be output to the software thread making the read access request.

Figure 3:
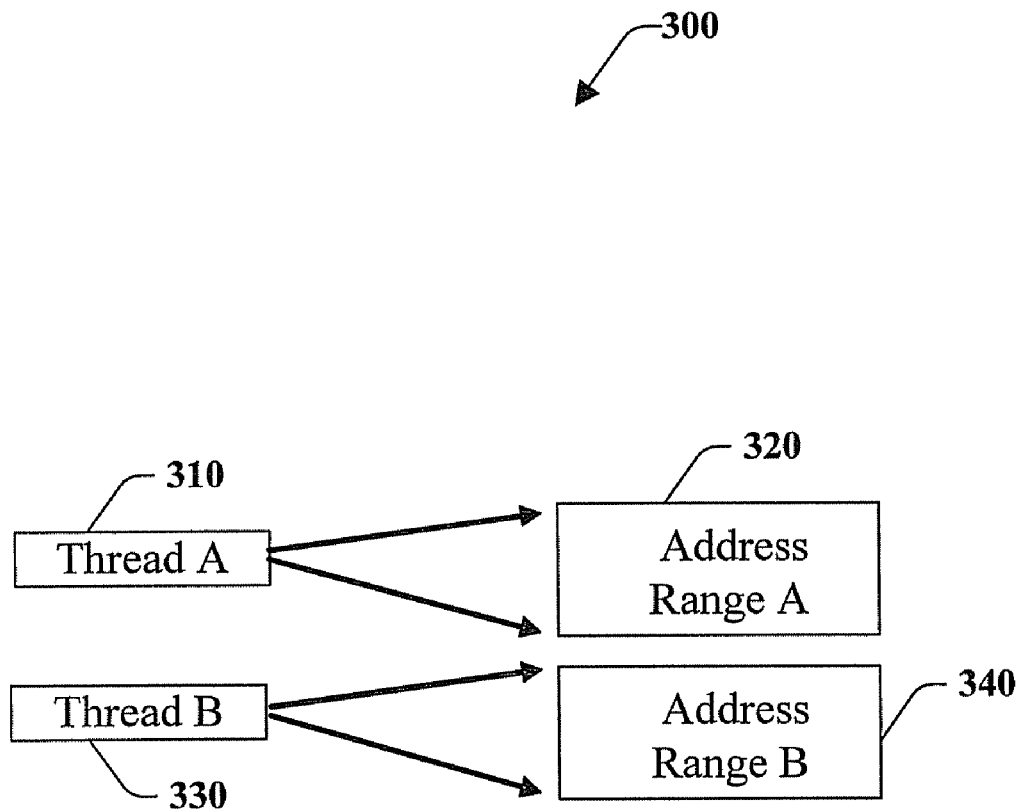
FIG. 3 illustrates a block diagram depicting associations between software threads and memory in accordance with one aspect of the invention.

Turning now to FIG. 3, a depiction 300 of an association between software threads and address regions is illustrated. Software thread A 310 is associated with address range A 320. The locality of accesses from thread 310 is contained between an upper and a lower memory address that defined address range 320. Similarly, address range B 340 is associated with software thread B 330. An upper and lower address of address range 340 is the region of memory utilized by software thread 330. Ranges 320 and 340 may correspond to a single row address or multiple row addresses. For example, to access all data in address ranges 320 and 340, it may be necessary to utilize several high order addresses. Accordingly, utilizing row address buffers to bank the high order addresses or row addresses in the locality of software threads 310 and 330 increases memory access performance by eliminating redundant address cycles.

Figure 4:
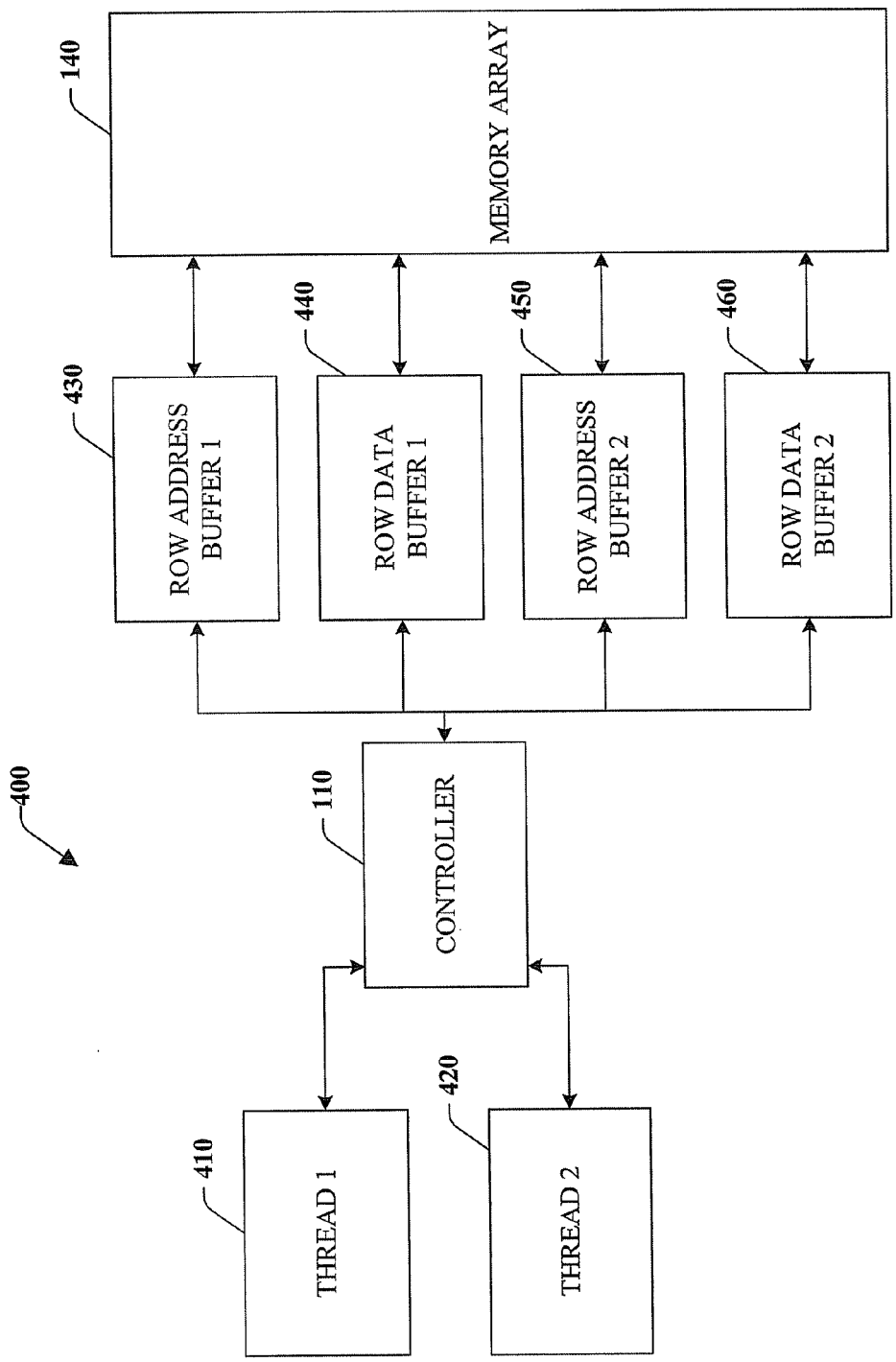
FIG. 4 illustrates a block diagram of a memory system associated with software threads in accordance with one aspect of the invention.

Referring to FIG. 4, a memory system 400 is illustrated. System 400 includes software threads 410 and 420. Software threads 410 and 420 interface with controller 110 to access data contained in memory array 140. The first read access into the memory device from software thread 410 results in controller 110 sending an Activate High command that loads a row address buffer 430 with the high order address or row address supplied by the software thread 410. Controller 110 associates row address buffer 430 with software thread 410. Controller 110 then sends an Activate Low command that combines the low order address or page address with the row address from row address buffer 430. The data in memory array 140 corresponding to the combined data is stored in a row data buffer 440. Row data buffer 440 is associated with software thread 410. A subsequent read access from software 410 for the data at the same address as the first read access results in the contents of row data buffer 440 being output to the software thread 410.

Controller 410 associates row address buffer 450 and row data buffer 460 with software thread 420. Since software threads 410 and 420 likely have different localities of accesses, separate row address buffers and row data buffers increases performance by eliminating reloading of row address buffers due to context switching of software threads 410 and 420. If a read access from software thread 420 contains a high order or row address stored in row address buffer 450, the controller 110 does not need to perform any action.

However, if the row address is not stored in row address buffer 450, controller 110 sends an Activate High command to load the high order address into row address buffer 450.

The page address included in the read access from software thread 420 is utilized by the controller to select row data buffer 460. If the data from memory array 140 corresponding to the page address is not loaded in row data buffer 460, controller 110 sends an Activate Low command to retrieve and store that data in row data buffer 460. If the page address results in a hit in the row data buffer 460, the data contained therein is output to software thread 420.

FIGS. 5-8 illustrate methodologies of utilizing row address and row data buffers to increase access performance in a memory device. While, for purposes of simplicity of explanation, the one or more methodologies shown herein (e.g., in the form of a flow chart or flow diagram) are shown and described as a series of acts, it is to be understood and appreciated that the subject innovation is not limited by the order of acts, as some acts may, in accordance therewith, occur in a different order and/or concurrently with other acts from that shown and described herein. For example, those skilled in the art will understand and appreciate that a methodology could alternatively be represented as a series of interrelated states or events, such as in a state diagram. Moreover, not all illustrated acts may be required to implement a methodology in accordance with the innovation.

Figure 5:
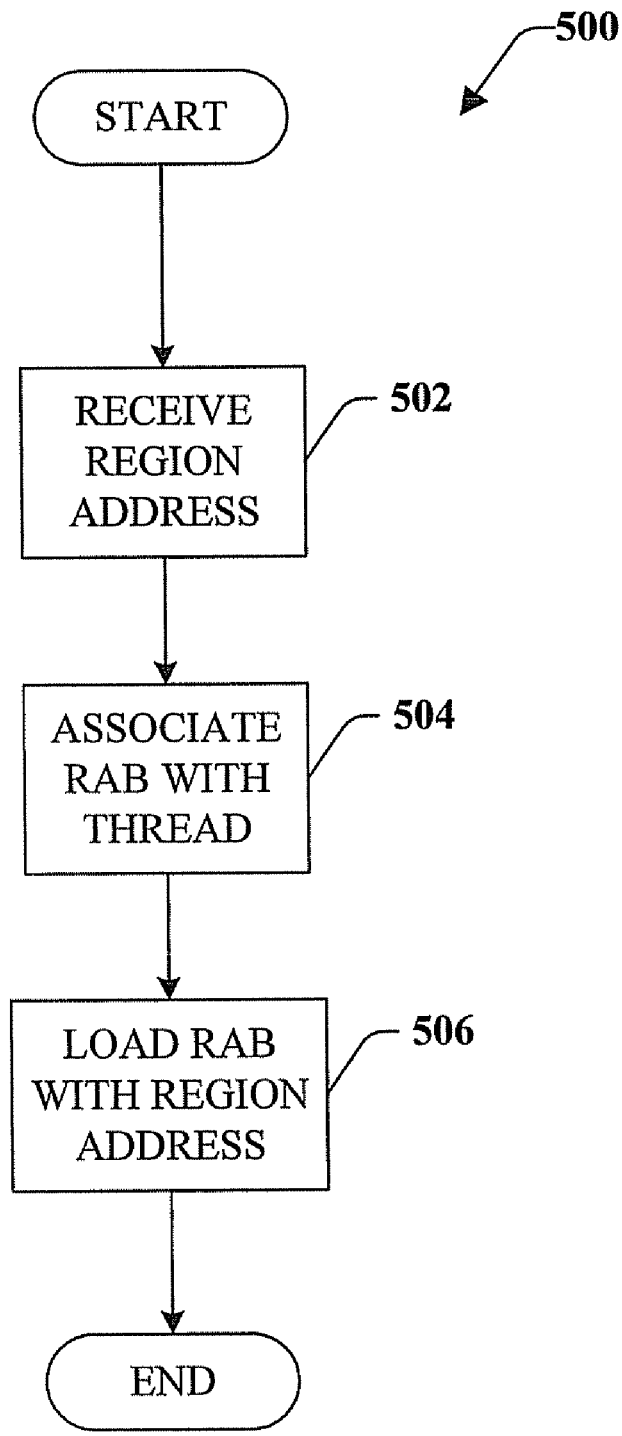
FIG. 5 illustrates a flow chart of a method of activating a row address buffer in accordance with one aspect of the invention.

Referring to FIG. 5, an exemplary methodology 500 for activating a row address buffer is depicted. At 502, a controller receives a row address from a software thread. The row address corresponds to a region of a memory device. At 504, the selects a row address buffer to be utilized. The controller associates the selected row address buffer with the software thread sending the row address. At 506, the controller loads the row address into the selected row address buffer associated with the software thread. The association of the row address buffer and the software thread provides for an association between the software thread and the address region corresponding to the software thread's locality of accesses.

Figure 6:
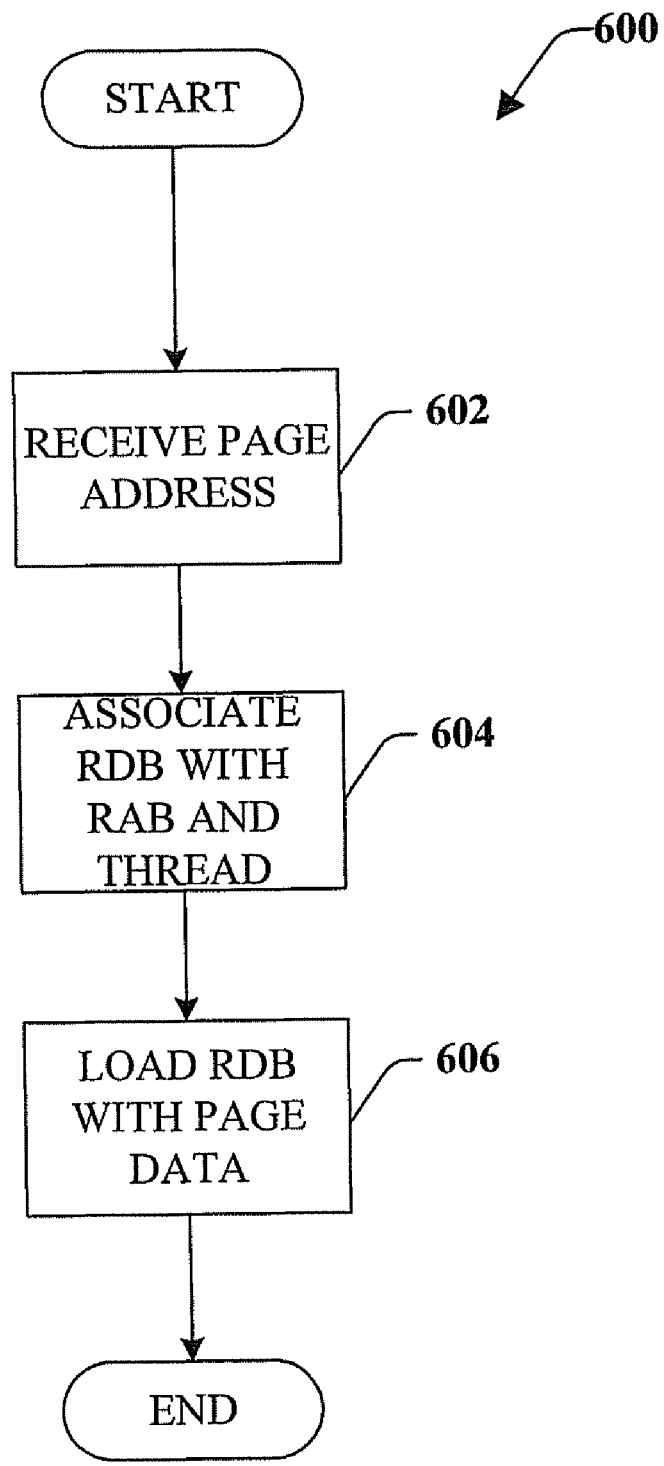
FIG. 6 illustrates a flow chart of a method of activating a row data buffer in accordance with one aspect of the invention.

Turning now to FIG. 6, an exemplary methodology 600 for activating a row data buffer is illustrated. At reference numeral 602, a controller receives a page address from a software thread. The page address corresponds to a page within a row or region of memory. At reference numeral 604, the controller selects a row data buffer from the set of row data buffers. The selected row data buffer is associated with a row address buffer containing the row address containing the requested page and the software thread. At reference numeral 606, the page address is combined with the row address contained in the associated row address buffer to select data from a memory device. The resultant data is stored in the selected row data buffer.

Figure 7:
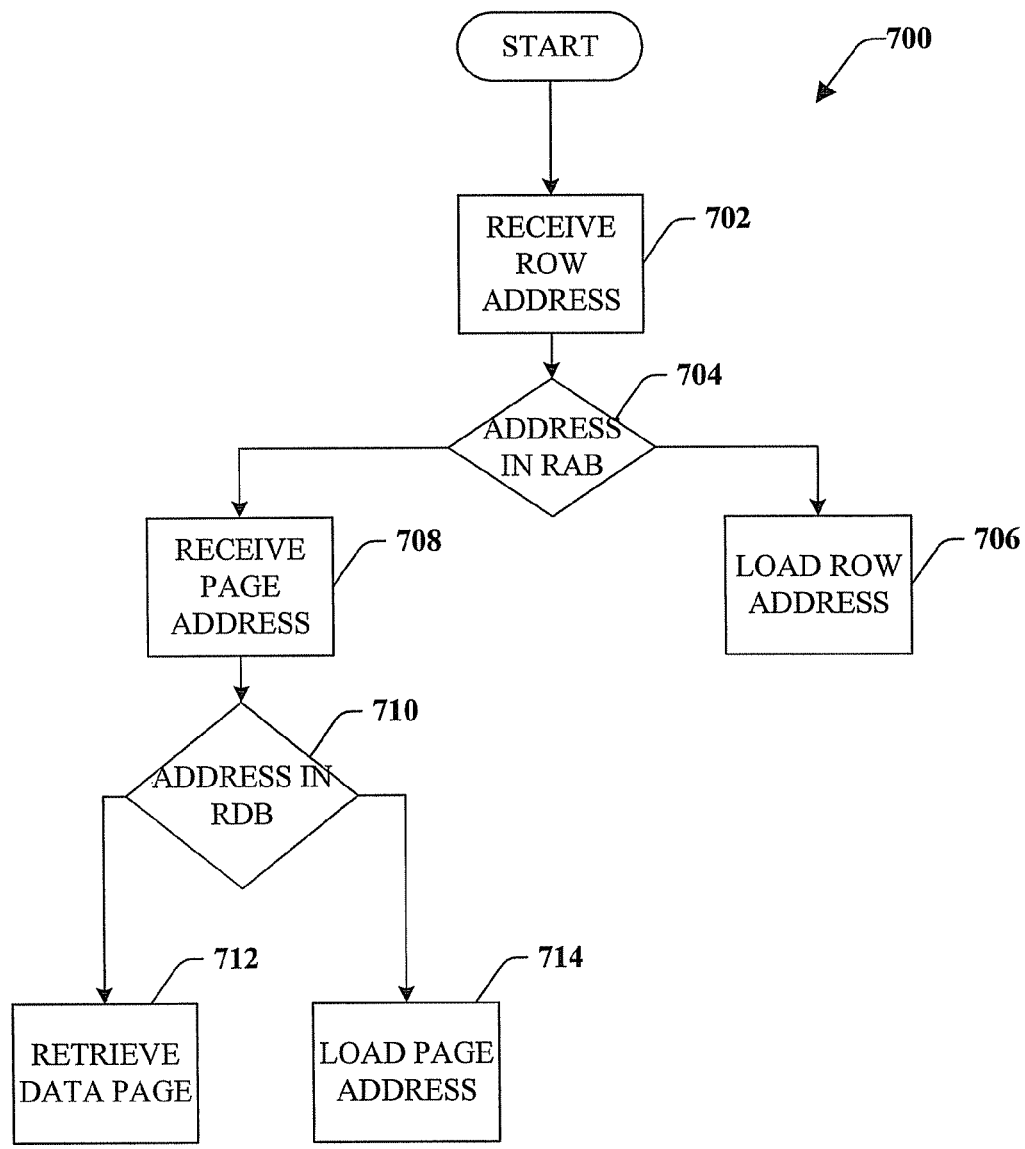
FIG. 7 illustrates a flow chart of a method of accessing a memory system utilizing row address and row data buffers in accordance with one aspect of the invention.

Referring now to FIG. 7, an exemplary methodology 700 for accessing data in a memory device is depicted. At reference numeral 702, a controller receives a row address from a software thread. The row address is a high order address corresponding to a region of memory of the memory device. At reference numeral 704, the controller determines if the row address is stored in a row address buffer associated with the software thread. If NO, the controller proceeds to reference numeral 706 where the controller loads the row address into a row address buffer as described with reference to FIG. 5. If YES, the controller receives a page address from the software thread at reference numeral 708.

At reference numeral 710, the controller determines if the page addresses corresponds to a row data buffer from a set of row data buffers already associated with. If YES, the controller retrieves the data from the row data buffer and outputs it to the software thread at reference numeral 712. If the page address does not hit a row data buffer, the controller loads data into a new row data buffer at reference numeral 714. The controller loads the data into a new data buffer as described supra with reference to FIG. 6.

Figure 8:
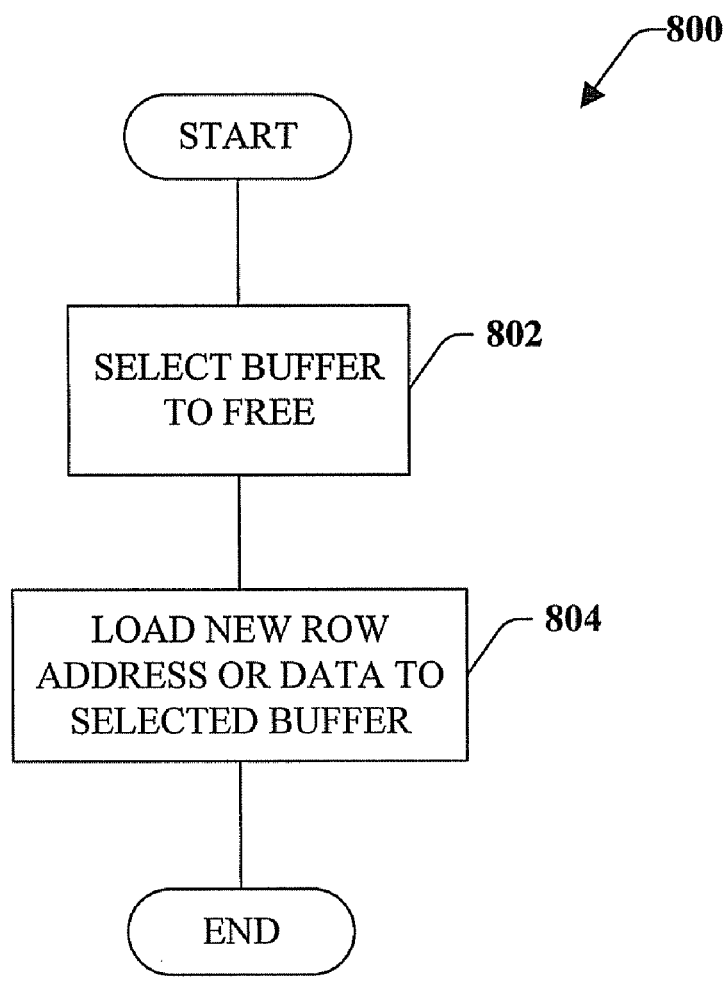
FIG. 8 illustrates a flow chart of a method of replacing buffer data in accordance with one aspect of the invention.

Turning now to FIG. 8, an exemplary methodology 800 for freeing a row data buffer or row address buffer if all buffers are unavailable or already utilized. At reference numeral 802, a row data or row address buffer is selected to be freed. A controller selects a buffer by utilizing a replacement policy. For example, one possible replacement policy is a least recently used policy. In a least recently used policy, the buffer that has not been accessed for the longest period of time is selected for replacement. It is to be appreciated that other replacement policies may be utilized such as least frequently used or an adaptive policy that balances least recently used and least frequently used. At reference numeral 804, the data in the selected row data buffer or row address buffer is overwritten with row data or a row address respectively. The buffer is associated with a new software thread and the previous association is broken.

Figure 9:
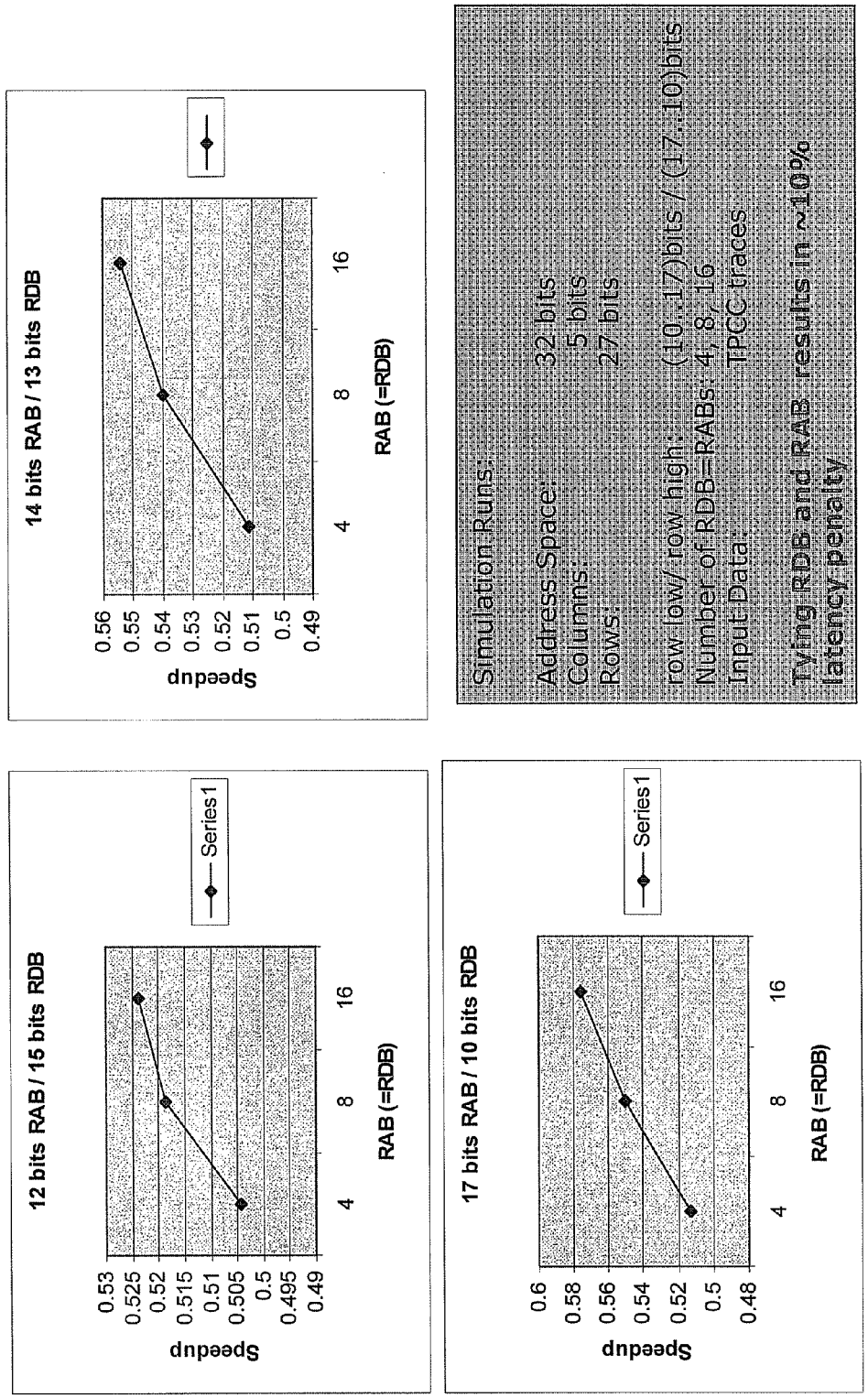
FIG. 9 depicts graphs indicating the performance increase from locked row address and row data buffers in accordance with one aspect of the invention.
Figure 10:
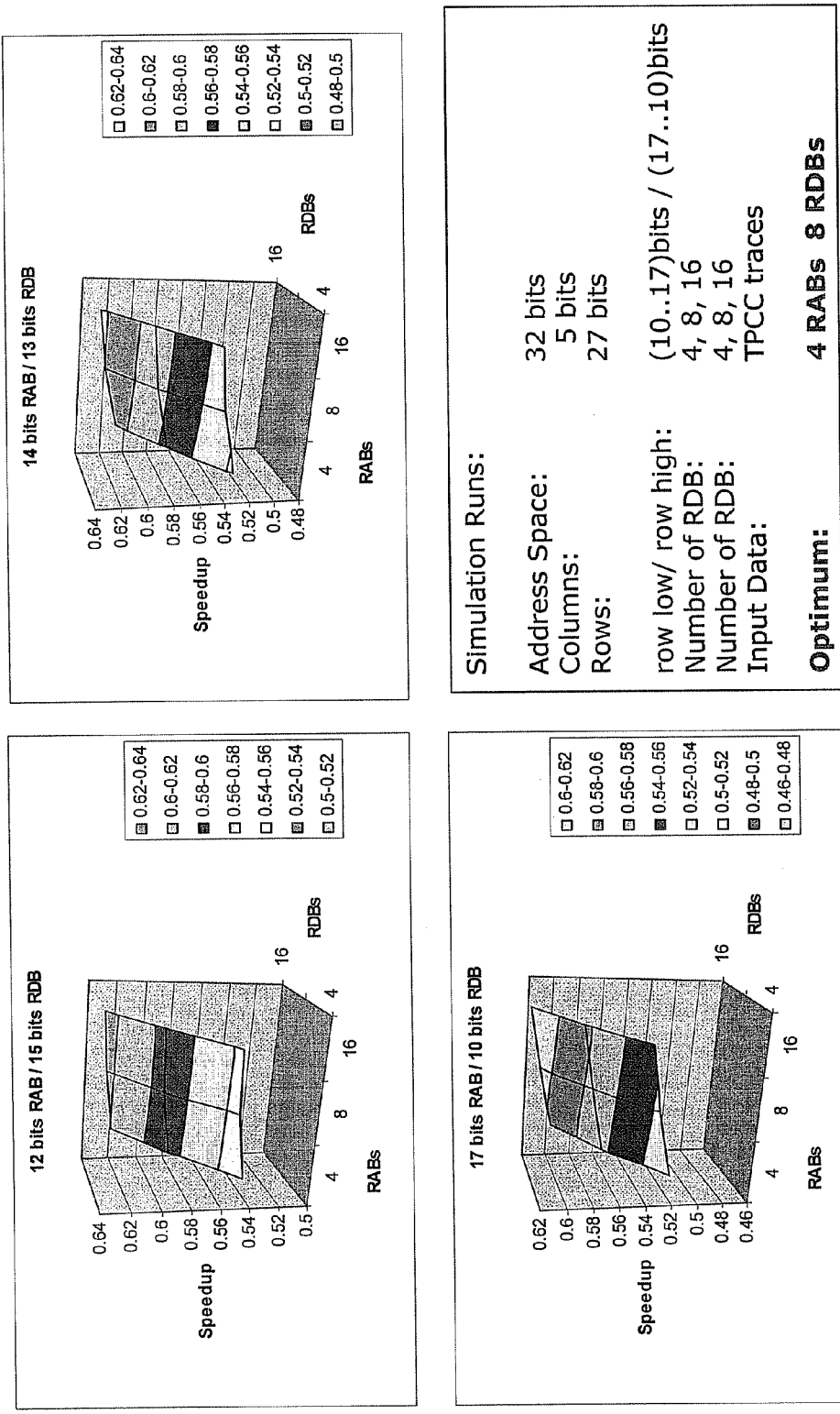
FIG. 10 depicts graphs indicating the performance of freely associated row address buffers and row data buffers in accordance with one aspect of the invention.

FIGS. 9 and 10 depict graphical results of simulations conducted on exemplary systems with row address buffers and row data buffers in accordance with the invention. Turning to FIG. 9, a series of three graphs are depicted. The graphs show memory access performance speedup as a function of a number of row address buffers. In the graphs depicted in FIG. 9, the number of row data buffers is equal to the number of row address buffers. Additionally, each graph shows a different curve as the 27 bits of the row address are distributed in a variety of ways between the row address buffers and row data buffers. The three graphs of FIG. 9 indicate an approximate 54% performance boost attributable to using row address buffer and row data buffer pairs that are tied together.

Referring now to FIG. 10, a series of three graphs are depicted. This set of graphs illustrate the performance speedup resulting from freely associating row address buffers and row data buffers as opposed to tying them together. In other words, the number of row address buffers can be greater or less than the number of row data buffers. As in FIG. 9, distributing the total number of row address bits differently between the row address buffers and the row data buffers results in different performance figures. The three graphs demonstrate that freely associating row address buffers and row data buffers can result in an additional approximately 10% performance boost over tying the buffers together.

As used in this application, the terms "component," "handler," "model," "system," and the like are intended to refer to a computer-related entity, either hardware, a combination of hardware and software, software, or software in execution. For example, a component can be, but is not limited to being, a process running on a processor, a processor, a hard disk drive, multiple storage drives (of optical and/or magnetic storage medium), an object, an executable, a thread of execution, a program, and/or a computer. By way of illustration, both an application running on a server and the server can be a component. One or more components may reside within a process and/or thread of execution and a component may be localized on one computer and/or distributed between two or more computers.

Additionally, these components can execute from various computer readable media having various data structures stored thereon. The components may communicate via local and/or remote processes such as in accordance with a signal having one or more data packets (e.g., data from one component interacting with another component in a local system, distributed system, and/or across a network such as the Internet with other systems via the signal). Computer components can be stored, for example, on computer-readable media including, but not limited to, an ASIC (application specific integrated circuit), CD (compact disc), DVD (digital video disk), ROM (read only memory), floppy disk, hard disk, EEPROM (electrically erasable programmable read only memory) and memory stick in accordance with the claimed subject matter.

As used herein, terms "to infer" and "inference" refer generally to the process of reasoning about or inferring states of the system, environment, and/or user from a set of observations as captured via events and/or data. Inference can be employed to identify a specific context or action, or can generate a probability distribution over states, for example. The inference can be probabilistic—that is, the computation of a probability distribution over states of interest based on a consideration of data and events. Inference can also refer to techniques employed for composing higher-level events from a set of events and/or data. Such inference results in the construction of new events or actions from a set of observed events and/or stored event data, whether or not the events are correlated in close temporal proximity, and whether the events and data come from one or several event and data sources.

What has been described above includes examples of the claimed subject matter. It is, of course, not possible to describe every conceivable combination of components or methodologies for purposes of describing the claimed subject matter, but one of ordinary skill in the art may recognize that many further combinations and permutations of the claimed subject matter are possible. Accordingly, the claimed subject matter is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A memory system that facilitates read access in a memory device comprising:
    a plurality of row address buffers, each row address buffer being configured to store and be associated with high order addresses, wherein the high order addresses include one or more most significant bits of memory addresses; and
    a plurality of row data buffers, each row data buffer configured to store non-transitory data of a memory array of a plurality of memory arrays,
    wherein each row address buffer freely associates with any row data buffer in the plurality of row data buffers such that a row data buffer paired to a row address buffer stores a portion of data of the memory array corresponding to a complete memory address;
    wherein the complete memory address has a high order address stored in the row address buffer and a lower order address which, when combined with the high order address, addresses the portion of data of the memory array, and each row address buffer is freely associated with one or more row data buffers, separately and one at a time, in response to incoming memory access requests; and
    a controller that associates each row address buffer with a software thread sending respective high order addresses such that each row address buffer of the plurality of row address buffers is not reloaded when at least one other software thread sends at least one other row address,
    the memory array is a flash memory array and the memory device is a non-volatile memory device, wherein the controller freely associates each row address buffer with any row data buffer of the plurality of row data buffers with a portion of bits from the complete memory address,
    the lower address selects the row data buffer from the plurality of row data buffers, wherein the controller freely associates each row address buffer with any row data buffer of the plurality of row data buffers with a multiplexor, wherein the multiplexor receives the portion of bits from the controller to select the memory array from the plurality of memory arrays to load the portion of data of the memory array corresponding to the complete memory address into the row data buffer selected, and
    the high order address corresponds to a locality region of the software thread, wherein the multiplexor receives the portion of data of the memory array corresponding to the complete memory address from each of the plurality of memory arrays and selects data from one of the memory arrays to load into the row data buffer based on the portion of bits.

2. The system of claim 1, the software thread is associated with the row address buffer storing the high order address to facilitate future read accesses.

3. The system of claim 1, wherein the software thread receives the portion of data of the memory array from the row data buffer instead of from the memory array.

4. The system of claim 3, the controller utilizes a replacement policy to free buffers from the plurality of row address buffers and the plurality of row data buffers, wherein the controller associates the software thread with more than one row data buffer and maintains subsequent memory accesses to the row data buffer despite context switching.

5. The system of claim 4, the replacement policy is a least recently used policy.

6. The system of claim 1, a number of row address buffers equals a number of row data buffers.

* * * * *